United States Patent
Straβburg et al.

(10) Patent No.: US 9,257,596 B2
(45) Date of Patent: Feb. 9, 2016

(54) LIGHT-EMITTING DIODE CHIP

(71) Applicant: OSRAM Opto Semiconductors GmbH, Regensburg (DE)

(72) Inventors: Martin Straβburg, Donaustauf (DE); Enrique Calleja-Pardo, Madrid (ES); Steven Albert, Madrid (ES); Ana Maria Bengoechea Encabo, Madrid (ES); Miguel Angel Sanchez-Garcia, Madrid (ES); Martin Mandl, Lappersdorf (DE); Christopher Kölper, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/371,722

(22) PCT Filed: Jan. 15, 2013

(86) PCT No.: PCT/EP2013/050665
§ 371 (c)(1),
(2) Date: Jul. 10, 2014

(87) PCT Pub. No.: WO2013/107737
PCT Pub. Date: Jul. 25, 2013

(65) Prior Publication Data
US 2014/0353581 A1  Dec. 4, 2014

(30) Foreign Application Priority Data
Jan. 20, 2012  (EP) .................................... 12151946

(51) Int. Cl.
*H01L 29/06* (2006.01)
*H01L 33/00* (2010.01)
(Continued)

(52) U.S. Cl.
CPC .......... *H01L 33/0075* (2013.01); *H01L 27/153* (2013.01); *H01L 33/06* (2013.01); *H01L 33/08* (2013.01); *H01L 33/18* (2013.01); *H01L 33/32* (2013.01)

(58) Field of Classification Search
USPC ................ 257/13, 9, 11, 12, 14, 79, E33.001; 438/47
See application file for complete search history.

(56) References Cited

U.S. PATENT DOCUMENTS

2005/0194598 A1  9/2005  Kim et al.
2007/0194330 A1  8/2007  Ibbetson et al.
(Continued)

FOREIGN PATENT DOCUMENTS

EP  2413385 A2  2/2012
FR  2904730 A1  2/2008
(Continued)

OTHER PUBLICATIONS

Bergbauer, W. et al., "Continuous-flux MOVPE growth of position-controlled N-face GaN nanorods and embedded InGaN quantum wells," Nanotechnology, 21, 2010, 305201, pp. 1-5.
(Continued)

*Primary Examiner* — Timor Karimy
(74) *Attorney, Agent, or Firm* — McDermott Will & Emery LLP

(57) ABSTRACT

A light-emitting diode chip comprising:—a semiconductor body (1) having a plurality of active regions (2), wherein—at least one of the active regions (2) has at least two subregions (21 . . . 28),—the active region (2) has at least one barrier region (3) arranged between two adjacent subregions (21 . . . 28) of said at least two subregions (21 . . . 28),—the at least two subregions (21 . . . 28) emit light of mutually different colour during operation of the light-emitting diode chip,—in at least one of the subregions (21 . . . 28) the emission of light is generated electrically, and—the barrier region (3) is configured to hinder a thermally activated redistribution of charge carriers between the two adjacent subregions (21 . . . 28), is specified.

16 Claims, 5 Drawing Sheets

Figure 1:
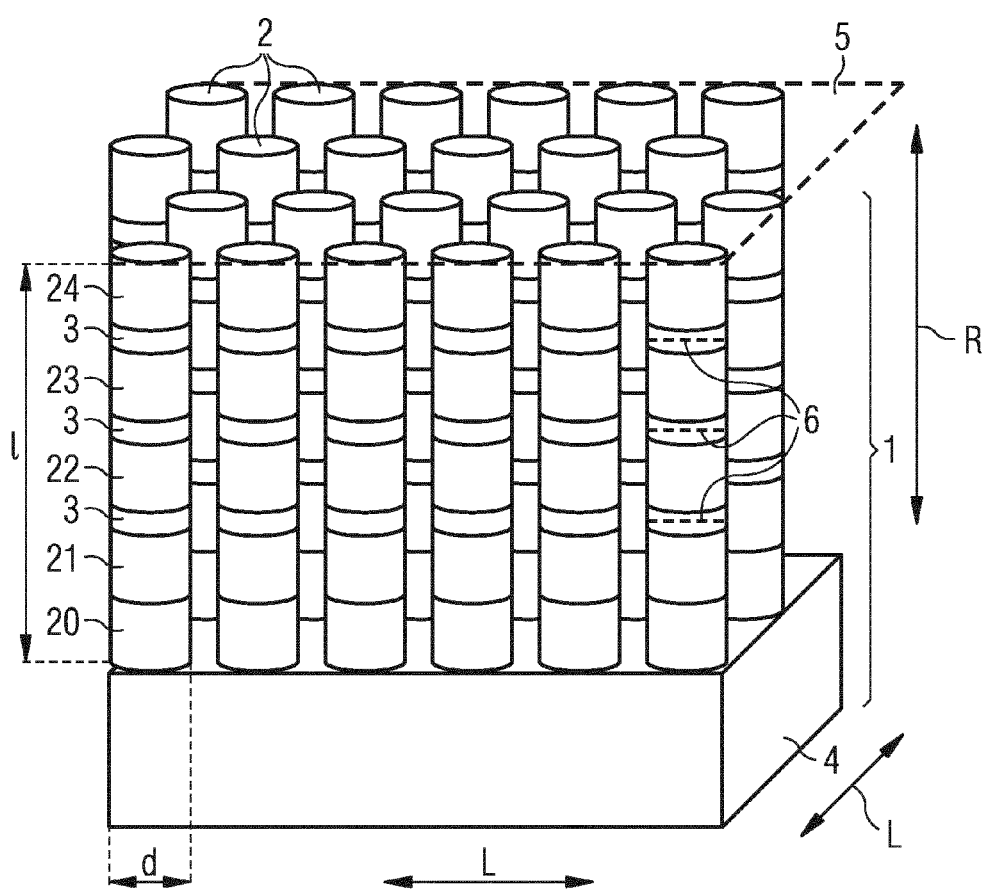

(51) Int. Cl.
  *H01L 33/08* (2010.01)
  *H01L 27/15* (2006.01)
  *H01L 33/06* (2010.01)
  *H01L 33/18* (2010.01)
  *H01L 33/32* (2010.01)

(56) References Cited

U.S. PATENT DOCUMENTS

| 2008/0001161 | A1 | 1/2008 | Kobayashi et al. | |
|---|---|---|---|---|
| 2008/0210956 | A1* | 9/2008 | Kim | H01L 33/08 |
| | | | | 257/88 |
| 2010/0148146 | A1 | 6/2010 | Bour et al. | |
| 2011/0133100 | A1* | 6/2011 | Kambhampati | B82Y 20/00 |
| | | | | 250/459.1 |
| 2011/0240955 | A1 | 10/2011 | Windisch et al. | |

FOREIGN PATENT DOCUMENTS

| JP | 2005228936 A | 8/2005 |
|---|---|---|
| JP | 2007049062 A | 2/2007 |
| JP | 2009-152474 A | 7/2009 |
| JP | 2011501881 A | 1/2011 |

OTHER PUBLICATIONS

Bergbauer, W. et al., "N-face GaN nanorods: Continuous-flux MOVPE growth and morphological properties," Journal of Crystal Growth, 315, 2011, pp. 164-167.

Lin, H. et al., "InGaN/GaN nanorod array white light-emitting diode," Applied Physics Letters, 97, Aug. 16, 2010, pp. 073101-1-073101-3.

Ristic, J. et al., "On the mechanisms of spontaneous growth of III-nitride nanocolumns by plasma-assisted molecular beam epitaxy," Journal of Crystal Growth, 310, 2008, pp. 4035-4045.

* cited by examiner

LIGHT-EMITTING DIODE CHIP

The document "On the mechanisms of spontaneous growth of III-nitride nanocolumns by plasma-assisted molecular beam epitaxy", Journal of Crystal Growth 310, 2008, pp 4035-4045, discloses a method for the production of III-nitride nanocolumns. The disclosure content of this document is herewith incorporated by reference.

The document "N-face GaN nanorods: Continuous-flux MOVPE growth and morphological Properties", Journal of Crystal Growth, 315, 2011, pp 164-167, discloses a method for the production of N-face GaN nanorods. The disclosure content of this document is herewith incorporated by reference.

The document "Continuous-flux MOVPE growth of position-controlled N-face GaN nanorods and embedded InGaN quantum wells", Nanotechnology 21 (2010) 305201 (5 pp), discloses a method for the production of N-face GaN nanorods. The disclosure content of this document is herewith incorporated by reference.

It is one object to specify a light-emitting diode chip which has an emission of electromagnetic radiation which shows a particularly good thermal stability.

According to one aspect of the light-emitting diode chip, the light-emitting diode chip comprises a semiconductor body having a plurality of active regions. For example most or all active regions are configured to emit electromagnetic radiation during operation of the light-emitting diode chip.

It is possible that all active regions of the semiconductor body are configured in the same manner and emit electromagnetic radiation of the same optical spectrum within the fabrication tolerance of the light-emitting diode. Then again, it is also possible that at least some of the active regions differ from each other with respect to their construction and/or the optical spectrum of the electromagnetic radiation emitted during operation of the light-emitting diode chip.

For example the semiconductor body has a large number of active regions of at least one thousand active regions, in particular of at least one million active regions.

According to one aspect of the light-emitting diode chip at least one of the active regions, in particular most of the active regions, for example all of the active regions, have at least two adjacent subregions. For example both of these subregions emit electromagnetic radiation during operation of the light-emitting diode chip. For example, the subregions of an active region are located spaced from each other within the active region. Each subregion can comprise at least one pn-junction and/or at least one quantum well structure and/or at least one multi-quantum well structure and/or at least one double hetero-structure. By employing such structures, the wavelengths of the light emitted by each subregion can be set particularly accurately. As an alternative, it is possible that a subregion does not comprise one of the mentioned structures, but the emission of electromagnetic radiation is due to the intrinsic band gap of the semiconductor material of the semiconductor body forming the active region. In this case, the fabrication of the active region is particularly easy to achieve.

According to one aspect of the light-emitting diode chip the active region has at least one barrier region which is arranged between two adjacent subregions of said at least two subregions. That means that two adjacent subregions of an active region are spaced from each other by a barrier region which, for example, has an interface with both adjacent subregions. The barrier region can be arranged directly between the two adjacent subregions. The barrier region differs from the subregions which adjoin the barrier region by the composition of the semiconductor material forming the barrier region and the adjoining subregions.

For example at least one of the active regions, in particular most of the active regions or all of the active regions, has three or more subregions, wherein a barrier region is arranged between each pair of adjacent subregions of the active region.

According to one aspect of the light-emitting diode chip the at least two subregions emit light of mutually different color during operation of the light-emitting diode chip. Thereby the subregions can emit light from the wavelength spectrum of UV-radiation to the wavelength spectrum of IR-radiation. At least two of the subregions, for example two adjacent subregions, emit light of mutually different color. Thereby it is possible that for example one of the subregions emits blue light and the other subregion emits green, yellow or red light. It is further possible that at least one of the subregions emits mixed light which has no pure color. In this case at least two subregions of the active region can emit different mixed light of different composition. For example one of the subregions emits bluish-green light wherein another subregion emits greenish-yellow light during operation of the light-emitting diode chip. For example a further subregion emits red-amber light during operation of the light-emitting diode chip. In sum white light can be produced.

According to one aspect of the light-emitting diode chip, in at least one of the subregions the emission of light is generated electrically. In other words, the subregion of the active region is pumped electrically and the emission of light is not due to an optically pumping of said subregion. Thereby it is possible that each subregion of the active region is electrically pumped so that the emission of light is generated electrically in each subregion of the active region. Further it is possible that the active region comprises electrically and optically pumped subregions. For example, the active region comprises exactly one subregion in which the emission of light is generated electrically and one or more subregions which are optically pumped by the light emitted in said exactly one electrically pumped subregion.

According to one aspect of the light-emitting diode chip the barrier region between two adjacent subregions is configured to hinder a thermally activated redistribution of charge carriers between said two adjacent subregions. Therefore, the barrier region, for example, has a larger band gap than the semiconductor material of the subregion adjoining the barrier region. The fact that the barrier region is configured to "hinder" a thermally activated redistribution of charge carriers means that without the barrier region the thermally activated redistribution is more likely than with the barrier region. In other words, the barrier region reduces the probability of a thermally activated redistribution of charge carriers between the two subregions adjoining the barrier region.

According to one aspect of the light-emitting diode chip the light-emitting diode chip comprises a semiconductor body having a plurality of active regions, wherein at least one of the active regions has at least two subregions, the active region has at least one barrier region arranged between two adjacent subregions of said at least two subregions, the at least subregions emit light of mutually different colour during operation of the light-emitting diode chip, in at least one of the subregions the emission of light is generated electrically, and the barrier region is configured to hinder a thermally activated redistribution of charge carriers between the two adjacent subregions.

White light emitting light-emitting diodes can suffer from strong temperature dependency of the color temperature and of the color coordinates of the emitted white light. Above this, a significant reduction in efficiency is observed within increasing temperatures for both white light generation with phosphor conversion or with light-emitting diodes of different color, where especially red light-emitting diodes are made of temperature-sensitive group III phosphides. In addition, the so-called "droop" in for example InGaN-based light-emitting diodes impairs high current operation due to sublinear increase of radiative emission and due to increased non-radiative losses like phonon-assisted Auger recombination and/or thermal escape and/or carrier overflow.

Today there is no real solution for these problems, but only some approaches mitigate these problems. For example regarding the "droop" effect, the light-emitting diodes can be operated at relatively low operation currents or at elevated currents with reduced efficiencies. With regard to the change of color coordinates depending on the operation temperature of light-emitting diodes phosphor conversion for temperature stable white color coordinates can be used by taking the burden of reduced conversion efficiency with increasing temperatures or relatively expensive solutions with light-emitting chips of different color. However, these solutions still suffer from a decrease in efficiency with increasing temperature. In addition, different materials for different colors would lead to different lifetimes of individual chips in solutions where light-emitting diode chips of different colors of emission are used. This limits the performance and the lifetime of such constructed light-emitting diodes.

For a here-described light-emitting diode chip the thermally activated redistribution of carriers is suppressed by the at least one barrier region. Hence, the ratio of photons generated in each subregion remains independent of the operation temperature and of the current density of the current running through the active region. Consequently, in the case of emission of white light by an active region of the semiconductor body the white light coordinates can be maintained nearly constant. In addition, each active region can be chosen to be thick enough to suppress the droop problem by providing a large defect-free volume for the light generation. In particular if the active regions are constructed as nanostructures like, for example, nanorods, an extraordinary high crystal quality can be achieved which allows for low non-radiative losses in the semiconductor material of the active regions.

According to one aspect of the light-emitting diode chip these active regions have a direction of main extension. Consequently, the active regions are elongated structures and, for example, not in the shape of an, e.g., planar layer. For example each active region has a preferred orientation in the direction of main extension. For example at least one, in particular most of or all active regions have the shape of a cylinder, a cone or a prism for example with a hexagonal base area. At lest some or all of the active regions are spaced apart from each other in a direction which runs in lateral direction with respect to the direction of main extension. For example most of or all active regions are arranged in a common plane which runs lateral or even perpendicular to the direction of main extension of the active regions. Further it is possible that at least some or all of the active regions partly touch each other in the lateral direction. In other words, side faces of adjacent active regions can be—at least in places—in direct contact with each other.

According to one aspect of the light-emitting diode chip the subregions of an active region are arranged along the direction of main extension of their active region and at least one barrier region is arranged between each pair of adjacent subregions. Consequently, the active region is given by a sequence of alternating subregions and barrier regions. For example, if the active region is in the form of a cylinder or a prism, the subregions and the barrier regions can be given by sections of said cylinder or said prism which are stacked on each other in the direction of main extension of the active region.

According to one aspect of the light-emitting diode chip the active regions are nanostructures and at least one of the active regions, in particular most of or all active regions of the light-emitting diode have a maximum diameter of 1000 nm and an aspect ratio of at least 3. A nanostructure is a nanoscale object having a diameter on its base which ranges from 1 to 1000 nm, for example 25 to 500 nm, in particular from 75 to 300 nm, preferably from 100 nm to 175 nm. The term "diameter" does not necessarily imply that the base of the nanostructure has a round shape. The maximum diameter denotes the maximum extension of the nanostructure in a direction perpendicular to its direction of main extension. For example the active regions are so-called "nanorods" which can be produced with an extraordinarily high crystal quality.

Further, it is possible that the nanostructure is, for example, a nano-column and/or a nano-pyramid and/or a mixture of both. The nanostructures have an aspect ratio (length divided by diameter) of at least 3. For example, the nanostructures can be directly produced on the top of a semiconductor body, for example by using a mask layer where the mask openings define the locations of the nanostructures. Further, it is possible that the nanostructures are produced independently from a carrier material and transferred to said carrier. Further, the nanostructures can be produced by etching into a semiconductor body.

According to one aspect of the light-emitting diode each subregion is based on a nitride compound semiconductor material.

In the present context, "based on a nitride compound semiconductor material" means that a subregion or at least one part thereof, comprises or consists of a nitride compound semiconductor material, for example GaN, $Al_nGa_{1-n}N$, $In_nGa_{1-n}N$ or else $Al_nGa_mIn_{1-n-m}N$, where $0 \le n \le 1$, $0 \le m \le 1$ and $n+m \le 1$. In this case, this material does not necessarily need to have a mathematically exact composition according to the above formula. Rather, it can comprise, for example, one or more dopants and additional constituents. For the sake of simplicity, however, the above formula only comprises the essential constituents of the crystal lattice (Al, Ga, In, N), even if these can be replaced and/or supplemented in part by small amounts of further substances. However, a nitride compound semiconductor material always comprises nitrogen or a nitrogen compound.

According to at least one aspect of the light-emitting diode chip, each subregion is based on a nitride compound semiconductor material comprising indium. Such an indium comprising nitride compound semiconductor material is a material that has a good thermal stability at the desired wavelength emitted or re-emitted by this material. However, high indium concentrations are difficult to achieve in conventional thin film structures, especially in thicker films (for example, having a thickness greater than 20 nm). However, it has been found that the indium content in active regions which are embodied as nanostructures can be very high without introducing crystal defects in the light-emitting structure, i.e. the semiconductor body.

In particular it is possible that each subregion comprises indium, in particular is based on an (Al,In,Ga)N or InGaN semiconductor material.

According to one aspect of the light-emitting diode chip, each barrier region is at least partly based on a nitride compound semiconductor material having a greater band gap than the subregions adjoining the barrier region. The barrier itself can consist of a semiconductor layer stack with different compositions and therefore band gaps of which some can be in the range or even lower than the subregion band gap.

For example, if the subregions are formed with a material based on an InGaN semiconductor material the barrier region can be based on GaN or AlInGaN or InGaN with less Indium than the adjoining subregion.

For example, the barrier regions are thinner than the subregions adjoining them. For example, the subregions have a thickness of at least 20 nm, in particular of at least 100 nm in the direction of main extension of their active region, wherein the barrier regions have a thickness of smaller than 1000 nm, in particular smaller than 100 nm, in the direction of main extension.

For example each active region comprises two or more subregions based on InGaN with different Indium concentrations in different subregions. The subregions are separated by barrier regions wherein between each pair of adjacent subregions a barrier region is arranged which is in direct contact with the two adjacent subregions. The barrier regions are thin in the direction of main extension which is also the growth direction of the active region. For example the barrier regions have a thickness of 30 nm at the most, typically of 4 nm at the most, preferably of 3 nm at the most. Typical thickness of the subregions is at least 10 nm, especially preferred at least 20 nm. Due to the defect-free growth of the active regions, for example the nanorods, those subregions may vertically, in growth axis direction, extent by 100 nm or more, each. Preferably each subregions of an active region is thicker than each barrier regions of the subregion.

The various subregions may differ in Indium concentration and/or thickness and each active region is chosen to produce monolithically white light or any other light within the garmut with desired correlated color coordinates. This can be achieved by the appropriate thickness and/or amount of respective InGaN subregions.

The material composition of the (Al,In,Ga)N barrier regions is chosen in a way to provide an almost equal barrier height between neighboring subregions. This allows a more homogeneous carrier distribution in the active region. For e.g., an InGaN based active region with blue (e.g. emission wavelength of about 460 nm), green (e.g. emission wavelength of about 530 nm), yellow (e.g. emission wavelength of about 570 nm) and red (e.g. emission wavelength of about 615 nm) subregions, it is advantage to chose one blue, three green, one yellow and three red light emitting subregions to compensate reduced efficiencies with increasing Indium concentrations and to tailor the color coordinates of the emitted light for high CRI and for high efficiency.

Two avoid increasing barrier height with increasing emission wavelength, the barrier regions between green and blue would be GaN or InGaN with a violet (equal to an emission wavelength of about 420 nm) band gap, between the green segments cyan (equal to an emission wavelength of about 480 nm) band gap and between green and yellow segments some kind of petrol (equal to an emission wavelength of about 500 nm) band gap, between yellow and red segments a green (equal to an emission wavelength of about 520-540 nm) band gap and between the red segments an yellow/amber (equal to an emission wavelength of about 560-590 nm) band gap. The re-absorption in the barrier regions is negligible compared to the unavoidable re-absorption in subregions with smaller band gaps. However, the small thickness of the barrier regions is supporting reduced absorption losses. Assuming the high crystalline quality in the active regions and hence very few non-radiative losses in the InGaN subregions, their internal quantum efficiency can be very high. Therefore, nearly only Stokes losses would contribute to losses for the re-absorption process.

For example the Indium concentrations for the different colours are as follows: blue 15-20%, green 25-30%, red ~40.%

With active regions based on InGaN, e.g. InGaN nanorods, with a varying Indium concentration along the growth axis it is possible to produce white light within a single active region. This allows to shrink the diameter of white light emitting diodes and hence e.g. the pixel size in a micro or nano display to below 50 nm, ultimately to about 20-30 nm. An array of such nanorods can be used as active region for white LEDs.

In general, the pn junction is in axial direction, with the p-side grown after the deposition of the active area InGaN subregions.

The problem in such structures is a limited stability of the color coordinates with varying temperatures: Due to increased carrier mobility and subsequent insensitivity against shallow localization centers, more carriers will be transferred to the lowest energy states and hence lead to an emission spectrum that is shifted towards longer wavelengths. To overcome this problem, the introduction of barrier regions as described above between vertical adjacent subregions of the active regions proves to be advantageous.

It is also possible that the active regions are based on a II-VI compound semiconductor material. For example, the subregions are then based on a II-VI compound semiconductor material having a smaller band gap than the barrier regions which also can be based on a II-VI compound semiconductor material. A II-VI compound semiconductor material comprises at least one element from the second main group, such as for example Be, Mg, Ca, Sr, Zn, Cd, Hg and one element from the sixth main group, such as for example O, S, Se, Te. In particular, a II-VI compound semiconductor material comprises a binary, ternary or quaternary compound, which comprises at least one element from the second main group and at least one element from the sixth main group. Such a binary, ternary or quaternary compound may moreover comprise for example one or more dopants and additional constituents. The II-VI compound semiconductor materials for example include: ZnO, ZnMgO, CdS, ZnCdS, MgBeO, ZnCdSe, ZnSSe.

In particular for active regions based on a II-VI compound semiconductor material, optically pumped subregions or active regions are possible. That means in particular in this case one or more of the subregions or of the active regions can be optically pumped.

Further it is possible that the light-emitting diode comprises active regions based on III-N compound semiconductor material which are electrically pumped and active regions based on II-VI compound semiconductor material which are optically pumped by said III-N regions.

According to one aspect of the light-emitting diode, in at least two subregions of the same active region the emission of light is generated electrically. For example in this case all subregions of the active region are pumped electrically. In this case the light in each subsection is predominantly generated by carrier injection.

In this case, a tunnel junction can be arranged between two electrically driven subregions. Thereby it is possible that the barrier region itself functions as a tunnel junction between two electrically driven subregions. For example, the electric contacts of the active regions are at the top and at the bottom of the plurality of active regions. Photons are generated by carrier injections in the active regions.

The tunnel junction can, for example, consist of two layers: A first layer is a p+ doped layer, e.g., p+ InGaN with an Indium content of >=5%. A second layer is an n+ layer, e.g., n+ InGaN with an Indium content >=3%.

A spacer can be arranged between the first and second layer and is introduced to prevent compensation of carriers. The spacer can consist of (Al,In,Ga)N. Spacer and/or both layers may consist of short period superlattices.

In particular, the band gap engineering of the active layer (internal or external electrical fields, gradient indium or discrete indium concentration in each subsection) allows specifically adjusted AlInGaN barriers with optimum barrier height and thickness to avoid carrier overflow and to provide required optical and electrical transparency of the barrier regions. According to one aspect the barrier consists of AlInGaN of a composition with a band gap larger than the surrounding subregions, in particular of InGaN with a band gap larger than the surrounding subregions. The thickness of the barrier layer is smaller than 100 nm, in particular smaller than 20 nm, especially smaller than 5 nm.

Barrier regions employed as tunnel junctions allow for a more efficient and controlled injection of the carriers in the neighboring subregions. The tunnel junction becomes more efficient with increasing Indium concentration and respective shrinkage of the band gap. This also allows an increased doping concentration, both, n-type and p-type. A clear benefit for the performance of the tunnel junctions and hence the barrier regions between adjacent subregions is given by the increased Indium concentration that is adjusted to the emission wavelength of each subregion. For a more precise and abrupt doping profile, a nominally undoped spacer between the p+ and n+ layer of the tunnel junction can be introduced. This spacer consists of one or more (Al,In,Ga)N layers. Suitable tunnel junctions are e.g. described in the document US2011/0012088 which is incorporated by reference. The thickness of the spacer layer is e.g. at most 5 nm, typically it is smaller than 2 nm. Preferably, the overall thickness of such a tunnel junction, hence barrier region, is at least 10 nm and at most 30 nm.

According to one aspect of the light-emitting diode in at least one first subregion of at least one active region the emission of light is generated electrically and in at least one second subregion of the same active region the emission of light is due to optically pumping by light of the first subregion. For example the barrier regions are n-doped in order to localize a pn-junction in a blue light-emitting or UV-radiation-emitting subsection of the active region. In this subregion the light is generated electrically and used to optically pump the subsequent subregion which, for example, follows in the direction of main extension. For example in the following subregions optically pumped green, yellow, amber and/or red light is produced. Thereby, the active region can form a light guide which guides the light of the at least one first subregion along the direction of main extension to the at least one second subregion. In other words, the pump light is guided along the longitudinal axis of the active region which reduced the loss of pump light.

Thereby a monolithically multi-color or white light emitting diode is also provided, in case only one or not all InGaN subregions are electrically pumped. In this particular version, the optically pumped InGaN subregions are grown on top of a p-type or n-type subregion and excited by light of shorter wavelength generated in the part of the same or neighboring active regions, which is electrically pumped. In this case, the thickness of the optically pumped subregions is chosen larger than 20 nm, typically 100 nm or more to support the absorption of short wavelength light and to increase the volume for light generation.

To allow a good p-contact, the thickness of the barrier regions between the electrically pumped and the optically pumped subregions is larger than 10 nm, typically larger than 100 nm to allow a sufficient large area for an electrically contacting with metal or TCO-material on the radial side-facets of the active regions in the respective height. By increasing the indium concentration in the p-type or n-type contact, a decrease in the Schottky barrier and/or transition resistance can be achieved reducing the operation voltage. For example an active region or each active region comprises one ore more blue light emitting InGaN subregion(s) being electrically pumped. A subsequent p-type InGaN barrier region is thicker than the above described barrier regions and has a thickness of at least 100 nm, e.g. of about 150 nm. The barrier region is followed by at least one optically pumped InGaN subregion. For example the thick barrier region is followed by three green light emitting subregions, two yellow light emitting subregions and three red light emitting subregions. There are also thin barrier regions introduced between each optically pumped subregion analog to the barriers described above. For the p-type subregion, Mg can be used as dopant. The shell area i.e. the sidewall of this subregion is used for establishing the electrical contact.

Advantageously the color coordinates and the color temperature of the light emitted by an active region can be adjusted by the number and/or the total volume of the subregions. For example by adjusting the indium concentration in each subregion, the colour of light produced in each subregion can be set. The indium content in each subregion can be determined via parameters like the growth temperature during fabrication of the active region, material fluxes and/or the growth rate during the growth of the subregions. The volume of each subregion can be varied by, for example, the distance of the barrier regions adjoining the subregion to obtain desired spectral distribution of the light emitted by the active region.

According to at least one aspect of the light-emitting diode chip at least one of the active regions is configured to emit white light. For example, the white light is mixed light which is composed by the light produced in the subregions of the active region. For example the active region comprises a subregion which emits blue light, a subregion which emits red light and a subregion which emits green light during operation of the light-emitting diode chip.

According to one aspect of the light-emitting diode chip at least one of the active regions, for example most of the active regions or all of the active regions have a subregion which is configured to emit white light. For example the indium concentration in this subregion is varied along the direction of main extension of the subregion in such a way that the subregion itself emits mixed light which, for example, is white light.

Further a method for producing a here described light-emitting diode chip is specified. With the method a here described light-emitting diode chip can be produced. Hence all features of the light-emitting diode chip are disclosed for the method.

In the following, the here-described light-emitting diode chip is explained in more detail with regard to embodiments of the light-emitting diode chip.

FIG. 1 shows schematic view of an embodiment of a here-described light-emitting diode chip.

In connection with FIGS. 2A, 2B, 2C, 3A, 3B, 4, 5, 6 the active regions for embodiments of here-described light-emitting diode chips are explained in more detail.

In the exemplary embodiments and the figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

FIG. 1 shows a schematic view of a here-described light-emitting diode chip. The light-emitting diode chip comprises a semiconductor body 1. The semiconductor body 1 has a first contact layer 4. For example the first contact layer 4 is formed by a semiconductor material which is based on a nitride compound semiconductor material. On one surface of the first contact layer 4 a plurality of active regions 2 is arranged. The active regions 2 are nanostructures which have a direction of main extension R and are spaced apart from each other in the lateral direction L which can be as small as that the nanostructures touch each other. For example, the active regions 2 are grown epitaxially on the top surface of the first contact layer 4.

Further it is possible that the growth substrate is removed and layer 4 is given by a carrier and/or a mirror layer. For example the mirror layer is formed with an Ag containing alloy having e.g. an Ag content <=100%. In this case the light-emitting diode chip can be of the thin-film design.

For example the active regions 2 are nanostructures which are epitaxially grown on the top surface of a semiconductor body. For example, the nanostructures are grown by means of MOVPE (metall organic vapor phase epitaxy) growth. Further, it is possible to grow the nanostructures by MBE (molecular beam epitaxy) growth.

The growth of the nanostructures can be performed in a self-organized way. Further is possible to use a mask layer for the growth of the nanostructures. For example a mask layer consisting of $SiN_x$, SiO2, Ti and/or Ni is formed on the top surface of the semiconductor body. In this case, seeds for each nanostructure can be formed in openings of the mask layer directly on the top surface. The nanostructures then grow in the region of each seed. The use of a mask layer enables the formation of nanostructures at preselectable positions. This allows for an accurate setting of the density of the nanostructures. For example, the density of the nanostructures can be efficiently controlled by the number and position of openings in the mask layer which can be patterned e.g. by lithography or nano-imprint lithography which transfer the pattern into an additional resist layer and via a subsequent etching step into the mask layer and/or the extension of the openings of the mask layer. The use of a mask layer allows for the production of regular ordered nanostructures and e.g. position controlled nanorod growth.

Further it is possible that the nanostructures are grown by means of MBE growth and the semiconductor body is grown by means of MOVPE growth. In particular, the nanostructures are then grown by self-organized MBE growth. This yields structures with high aspect ratios and small diameters with, for example, a mean diameter for all nanostructures less or equal 70 nm, for example less or equal 50 nm. Consequently, a high density of the nanostructures can be reached by employing MBE growth of nanostructures. Further, the MBE growth of nanostructures provides excellent control of the indium concentration in the group III-nitride and indium concentrations up to 100% are possible. Therefore, MBE growth of nanostructures can be employed when especially high indium concentrations are needed.

In the embodiment of FIG. 1 each active region 2 is shown as a so-called nanorod which has a cylindrical shape. Each active region 2 comprises subregions 21, 22, 23, 24 which are also of cylindrical shape, wherein barrier regions 3 are arranged between adjacent subregions. Thereby it should be noted that the subregions 21, 22, 23, 24 and the barrier regions 3 can exhibit any shape. There is no need for an identical shape of neighbouring subregions and barriers. Nevertheless, for the sake of simplicity all figures contain areas with disk-like or cylindrical shape.

The active regions 2 have a maximum diameter d of <1000 nm and a length 1 of at least three times the maximum diameter. Each active region 2 comprises subregions in which light of mutually different colour is produced. The area region 3 between the subregions 21, 22, 23, 24 hinder a thermally activated redistribution of charge carriers between two adjacent subregions. For example all subregions of each active layer can be driven electrically. In this case tunnel junctions 6 are arranged between adjacent subregions. Due to the junctions 6 each subregion emits light which is generated by carrier injection in the respective subregion. This allows a determination of the number of photons per colour, defined by the subregions, their indium content and their volume and the external quantum efficiency of each subregion.

On the other hand it is possible that only the subregion 21 nearest to one of the contact layers e.g. the first contact layer 4 is electrically driven and the production of radiation in the subsequent subregions 22, 23, 24 is due to an optically pumping of these subregions with light from the first subregion 21. As the highest efficiency of, for example, InGaN-based subregions is achieved in the blue spectral range, this is a very efficient solution. Due to the geometry of the active regions 2, the pump light generated in the first subregion 21 is guided along the direction of main extension R and thicker areas for efficient conversion of blue light to light of different colors are enabled. Thereby a good light coupling is achieved and all colors to be converted can be generated in InGaN-based material which additionally reduces interface losses between the subregions of different colour as there is a good match of the refractive index between adjacent subregions. In this case, it is more efficient to place the subregion emitting the longest wavelength, e.g. red, closest to the electrically driven pump region and the subregion of the shortest wavelength, e.g. green, furthest away in order to minimize reabsorption losses in longer wavelength subregions.

The light-emitting diode chip according to FIG. 1 further comprises a second contact 5. For example the second contact 5 can be a layer which, for example, can be formed with a material transparent or translucent for the light generated in the subregions. For example the second contact 5 is made of transparent conductive oxide like ITO or ZnO. Further it is possible that the second contact 5 is a thin layer of conducting grapheme. But also other configurations of the contact 5 are possible.

Figure 2A:
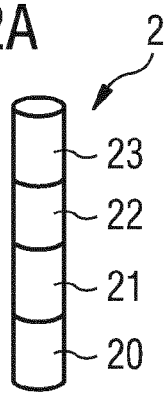
Figure 2B:
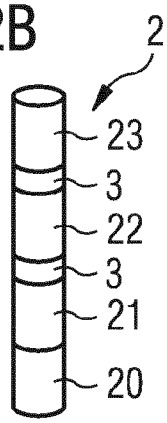

FIG. 2A shows a single active region 2 with three subregions 21, 22, 23. For example the first subregion 21 is configured to emit blue light, the second subregion 22 is configured to emit green light and the third subregion 23 is configured to emit red light during operation of the light-emitting diode chip. FIG. 2B shows a similar active region 2, where barrier regions 3 having a greater band gap than the surrounding semiconductor material of the subregions are arranged between two adjacent subregions. Each active region has a first region 20 which is, for example, of the same material as the barrier regions 3. For example the first region 20 is based on GaN and n-doped. In this case the first region 20 e.g. consists of n-GaN. For example the subregions 21, 22, 23 are based on an InGaN-semiconductor material, wherein the barrier regions 3 are based on GaN or AlInGaN or InGaN.

Each active region can have a last region 30 (not shown in each figure) which is, for example, based on GaN and p-doped. The last region 30 is arranged on a side of the active region facing away from the first regions 20.

Figure 2C:
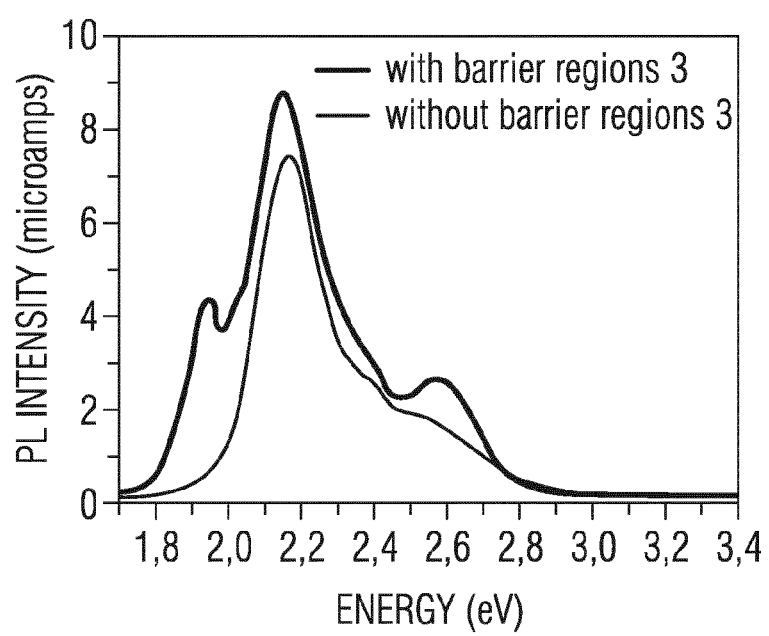

FIG. 2C shows a comparison between the photoluminescence spectra for the active region 2 of FIG. 2A without a barrier and the active region 2 of FIG. 2B with a barrier. From the comparison it becomes clear that light produced by the active layer with barrier region 3 is brighter and the spectrum is broader than for active regions without barrier region 3.

Figure 3A:
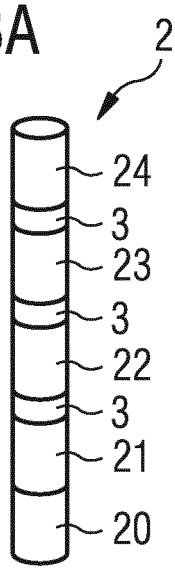

In FIG. 3A an active region 2 is shown having three GaN barrier regions 3 within an active region having a length of about 500 nm. The active region 2 has four subregions 21, 22, 23, 24, each having different but discreet indium concentrations to provide emission of blue, green, yellow and red light. Thereby the volume for the subregion 24 can be greater than the volume for the subregion 23, the volume of the subregion 23 can be greater than the volume of the subregion 22 and the volume of the subregion 22 can be greater than the volume of the subregion 21. Taking into account for the respecting quantum efficiency the volume of the individual subregions can be used to adjust the fraction of the corresponding wavelength in the total spectrum. Thereby, the size of the volume of each subregion compensates the different amount of pump light reaching the subregion and the different quantum efficiencies for the production of light of different colors in the InGaN-based material of the subregions.

Figure 3B:
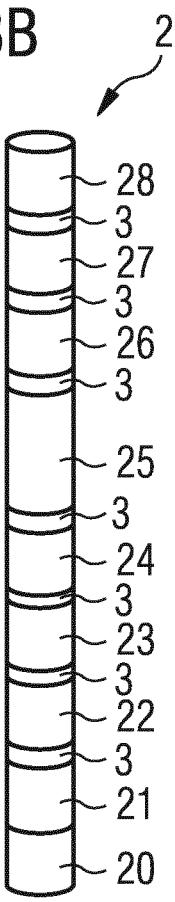

FIG. 3B shows a similar active region 2 with even more subregions in order to set a specific colour coordinate and colour temperature of the emitted mixed light. For example, the active region comprises two subregions 21, 22 for the production of blue light, two subregions 23, 24 for the production of green light, one subregion 25 for the yellow light and three subregions 26, 27, 28 for the production of red light.

Figure 4:
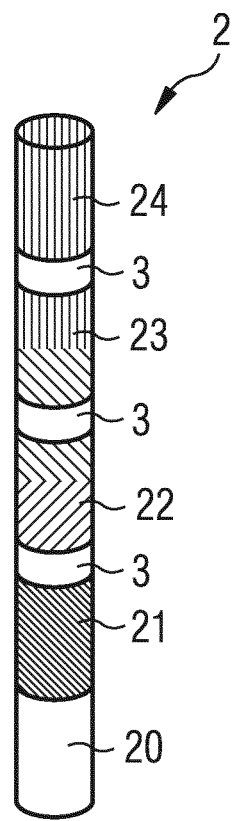

FIG. 4 shows an active region 2 having four subregions 21, 22, 23, 24, each subregion emitting mixed light. For example the first subregion 21 emits greenish-blue light, the second subregion 22 emits yellow-greenish light, the third subregion 23 emits orange light and the fourth subregion 24 emits red light. For example, the different colors are produced by a gradient of the indium concentration wherein each subsection has an indium gradient where the previous subsection ends with the same indium concentration as the following section starts with.

Figure 5:
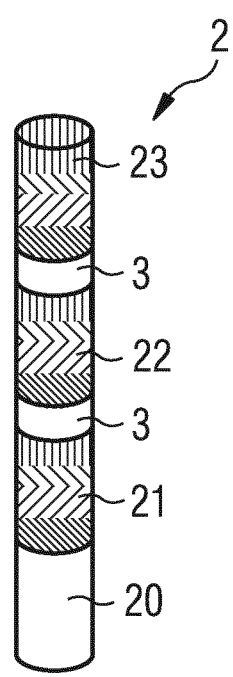

FIG. 5 shows an active region 2 having two barrier regions 3, within an active region 2 having a length 1 of for example 800 nm, wherein each subregion 21, 22, 23 has a gradient indium concentration in the direction of main extension R. For example, each subregion is configured to emit white light and the barriers are tunnel junctions.

Thereby, it is possible that a here-described light-emitting diode chip has a plurality of active regions 2 which are all configured in the same way. Further, it is possible that one light-emitting diode chip comprises active regions of different composition such that at least two of the active regions differ from each other with respect to their composition.

Figure 6:
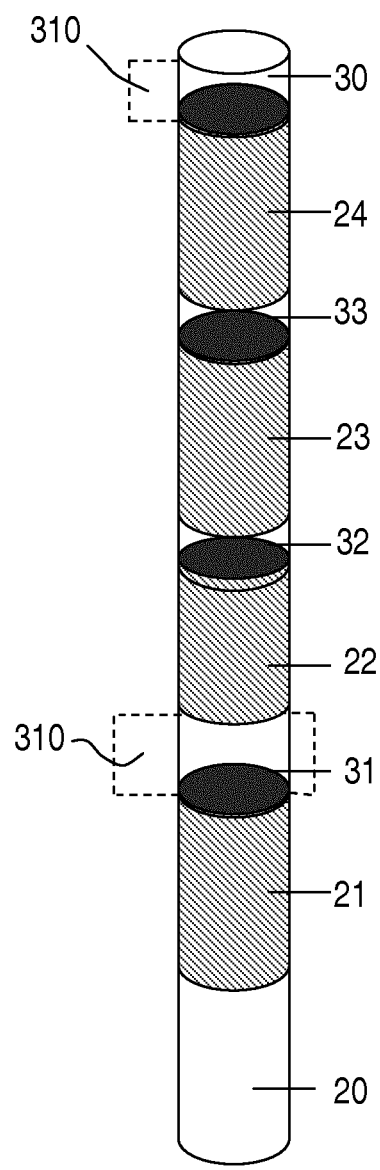

In connection with FIG. 6 further examples for a here described active region 2 are given. For example the active region 2 can have the following configurations:

Configuration A.
20: n-GaN first region
21: electrically pumped blue light emitting InGaN subregion
31: p-GaN first barrier region which forms the electrical p-contact of the active region
22: optically pumped red light emitting InGaN subregion
32: second barrier region
23: optically pumped yellow light emitting InGaN subregion
33: third barrier region
24: optically pumped green light emitting InGaN subregion
30: GaN last region In configuration A the current only runs through the electrically pumped blue light emitting InGaN subregion 21. The first barrier region 31 is p-doped and forms a p-contact of the active region. In this example a thick barrier region 31 is arranged between the first subregion 21 and the second subregion 22, wherein the thick barrier region 31 has a thickness of at least 100 nm. The thick barrier region 31 is based on a semiconductor material having a greater band gap than the first 21 and the second subregion 22 adjoining the thick barrier region, and an electrically conductive material 310 is applied to a side facet of the thick barrier region 31, wherein the first subregion 21 is electrically contacted via the electrically conductive material 310. The remaining barrier regions are thin barrier regions having a thickness of 30 nm at the most. For example the electrically conductive material 310 is given by a metal or a TCO-material.

Configuration B.
20: n-GaN first region
24: electrically pumped blue light emitting InGaN subregion
31: n-doped first barrier region
23: optically pumped red light emitting (n)-InGaN subregion
32: n-doped second barrier region
22: optically pumped yellow light emitting (n)-InGaN subregion
33: n-doped third barrier region
21: optically pumped green light emitting (n)-InGaN subregion
30: p-GaN last region In configuration B the current runs through all subregions. However, only the blue light emitting InGaN subregion 24 is electrically pumped. The electrically conductive material 310 is applied to p-GaN region 30.

Configuration C.
20: n-GaN first region
21: blue light emitting InGaN subregion
31: GaN or InGaN barrier region with gap energy of at least 3,4 eV
22: green light emitting InGaN subregion
32: InGaN barrier region with gap energy of at least 2,8 eV
23: yellow light emitting InGaN subregion
33: InGaN barrier region with gap energy of at least 2,4 eV
24: red light emitting InGaN subregion
30: p-GaN last region In configuration C the current runs through all subregions. However, only the blue light emitting InGaN subregion 21 is electrically pumped.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A light-emitting diode chip comprising:
a semiconductor body having a plurality of active regions, wherein
at least one of the active regions has at least two subregions,
the active region has at least one barrier region arranged between two adjacent subregions of said at least two subregions,
the at least two subregions emit light of mutually different colour during operation of the light-emitting diode chip,
in at least one of the subregions the emission of light is generated electrically,
the barrier region is configured to hinder a thermally activated redistribution of charge carriers between the two adjacent subregions,
the active regions have a direction of main extension,
at least some of the active regions are spaced apart from each other in a direction which runs lateral with respect to the direction of main extension or at least some of the active regions partly touch each other in the lateral direction,
the active regions are nanostructures and at least one of the active regions has a maximum diameter of 1000 nm and an aspect ratio of at least 3,
the subregions are arranged along the direction of main extension of their active region and exactly one barrier region is arranged between each pair of adjacent subregions,
each subregion is based on a nitride compound semiconductor material comprising indium and based on an (Al, In,Ga)N, in particular an InGaN, semiconductor material,
each barrier region is based on at least one nitride compound semiconductor material having a greater band gap than the subregions adjoining the barrier region,
each barrier region is based on GaN or AlInGaN or InGaN, and
each barrier region is thinner in the direction of main extension of the active region than each subregion.

2. The light-emitting diode chip according to claim 1, wherein
the active regions have a direction of main extension, and
at least some of the active regions are spaced apart from each other in a direction which runs lateral with respect to the direction of main extension or at least some of the active regions partly touch each other in the lateral direction.

3. The light-emitting diode chip according to claim 1, wherein
the subregions are arranged along the direction of main extension of their active region and at least one barrier region is arranged between each pair of adjacent subregions.

4. The light-emitting diode chip according to claim 1, wherein
the active regions are nanostructures and at least one of the active regions has a maximum diameter of 1000 nm and an aspect ratio of at least 3.

5. The light-emitting diode chip according to claim 1, wherein
each subregion is based on a nitride compound semiconductor material comprising indium, in particular based on an InGaN semiconductor material.

6. The light-emitting diode chip according to claim 1, wherein
each barrier region is based on at least one nitride compound semiconductor material having a greater band gap than the subregions adjoining the barrier region.

7. The light-emitting diode chip according to claim 1, wherein
each barrier region is based on GaN or AlInGaN or InGaN.

8. The light-emitting diode chip according to claim 1, wherein
in at least two subregions of the at least one active region the emission of light is generated electrically, and
a tunnel junction is arranged between two electrically driven subregions.

9. The light-emitting diode chip according to claim 8, wherein
the barrier region between the two electrically driven subregions is employed as the tunnel junction.

10. The light-emitting diode chip according to claim 1, wherein
in a first subregion of the at least one active region the emission of light is generated electrically and in a second subregion of the same active region and adjacent to the first subregion the emission of light is due to optically pumping by light of the first subregion.

11. The light-emitting diode chip according to claim 10, wherein
the active region forms a light-guide which guides the light of the first subregion along the direction of main extension to the second subregion.

12. The light-emitting diode chip according to claim 11, wherein
a thick barrier region is arranged between the first subregion and the second subregion,
the thick barrier region has a thickness of at least 100 nm,
the thick barrier region is based on a semiconductor material having a greater band gap than the first and the second subregions adjoining the thick barrier region, and
an electrically conductive material is applied to a side facet of the thick barrier region, wherein the first subregion is electrically contacted via the electrically conductive material.

13. The light-emitting diode chip according to claim 1, wherein
at least one of the active regions is configured to emit white light.

14. The light-emitting diode chip according to claim 1, wherein
at least one of the active regions has a subregion which is configured to emit white light.

15. A method for producing a light-emitting diode chip comprising the following steps:
epitaxial growth of a semiconductor body having a plurality of active regions, wherein
at least one of the active regions has at least two subregions,
the active region has at least one barrier region arranged between two adjacent subregions of said at least two subregions,
the at least two subregions emit light of mutually different colour during operation of the light-emitting diode chip,
in at least one of the subregions the emission of light is generated electrically,
the barrier region is configured to hinder a thermally activated redistribution of charge carriers between the two adjacent subregions,
the active regions have a direction of main extension, the active regions are spaced apart from each other in a direction which runs lateral with respect to the direction of main extension, the subregions are arranged along the direction of main extension of their active region and at least one barrier region is arranged between each pair of adjacent subregions, the active regions are nanostructures and at least one of the active regions has a maximum diameter of 1000 nm and an aspect ratio of at least 3, each subregion is based on a nitride compound semiconductor material comprising indium, in particular based on an InGaN semiconductor material, each barrier region is based on at least one nitride compound semiconductor material having a greater band gap than the subregions adjoining the barrier region, in at least one first subregion of the at least one active region the emission of light is generated electrically and in at least one second subregion of the same active region the emission of light is due to optically pumping by light of the first subregion, the active region forms a light-guide which guides the light of the at least one first subregion along the direction of main extension to the at least one second subregion, at least one of the active regions is configured to emit white light, and at least one of the active regions has a subregion which is configured to emit white light.

16. A light-emitting diode chip comprising:

a semiconductor body having a plurality of active regions, wherein at least one of the active regions has at least two subregions, the active region has at least one barrier region arranged between two adjacent subregions of said at least two subregions, the at least two subregions emit light of mutually different colour during operation of the light-emitting diode chip, in at least one of the subregions the emission of light is generated electrically, the barrier region is configured to hinder a thermally activated redistribution of charge carriers between the two adjacent subregions, in a first subregion of the at least one active region the emission of light is generated electrically and in a second subregion of the same active region and adjacent to the first subregion the emission of light is due to optically pumping by light of the first subregion, a thick barrier region is arranged between the first subregion and the second subregion, wherein the thick barrier region has a thickness of at least 100 nm, the thick barrier region is based on a semiconductor material having a greater band gap than the first and the second subregions adjoining the thick barrier region, and an electrically conductive material is applied to a side facet of the thick barrier region, wherein the first subregion is electrically contacted via the electrically conductive material.

* * * * *